United States Patent [19]

Motte et al.

[11] Patent Number: 4,895,789
[45] Date of Patent: Jan. 23, 1990

[54] METHOD OF MANUFACTURING NON-LINEAR RESISTIVE ELEMENT ARRAY

[75] Inventors: Shunichi Motte; Mitsuya Suzuki, both of Tokyo, Japan

[73] Assignee: Seiko Instruments Inc., Tokyo, Japan

[21] Appl. No.: 174,833

[22] Filed: Mar. 29, 1988

[51] Int. Cl.$^4$ .............................................. G03C 5/00
[52] U.S. Cl. ...................................... 430/316; 430/20; 430/330; 350/334
[58] Field of Search ................. 430/321, 20, 314, 316, 430/325, 326, 330, 313; 350/334

[56] References Cited

U.S. PATENT DOCUMENTS 4,738,513  4/1988  Nishiura et al. .................... 350/332
4,828,370  5/1989  Suzuki .............................. 350/339 R
4,842,372  6/1989  Toyama ............................. 350/334

Primary Examiner—José G. Dees
Attorney, Agent, or Firm—Bruce L. Adams; Van C. Wilks

[57] ABSTRACT

A method for manufacturing a non-linear resistive element array on a substrate, comprising: depositing a first conductive layer on the substrate and selectively forming the layer in a desired pattern; depositing a non-linear resistive layer on the first conductive layer; depositing a second conductive layer on the non-linear resistive layer; forming the second conductive layer in a desired pattern by etching process using a patterned resist layer as a mask; and forming the non-linear resistive layer in a desired pattern using the resist layer as a mask.

17 Claims, 4 Drawing Sheets

METHOD OF MANUFACTURING NON-LINEAR RESISTIVE ELEMENT ARRAY

BACKGROUND OF THE INVENTION

This invention relates to a method of manufacturing a non-linear resistive element which may be combined with an electro-optical material such as a liquid crystal or the like to form an electro-optical device, for example, an image display device, a shutter for a printer or the like.

FIGS. 5a to 5c are sectional views showing a conventional method of manufacturing a non-linear resistive element. FIG. 5a is a sectional view showing a light-transmissive insulating substrate 1 made of glass, quartz or the like which has a picture element electrode 2 formed thereon by a first photoetching process, the picture element electrode 2 being defined by a light-transmissive conductive layer made of ITO (Indium-Tin Oxide) or the like. As shown in FIG. 5b, a non-linear resistive layer 3 is deposited and then formed in a predetermined shape by a second photoetching process. Then, as shown in FIG. 5c, a conductive layer 4 of Cr, al or the like which defines a row or column electrode is deposited by sputtering or the like and then formed in a predetermined shape by a third photoetching process.

The above-described conventional method for producing a non-linear resistive element suffers from the disadvantages that three masking steps lead to many defects being generated during the process, resulting in a reduction in production yield.

SUMMARY OF THE INVENTION

In view of the above-described problems of the prior art, it is a primary object of the invention to provide a method of manufacturing a non-linear resistive element which enables a reduction in the number of masking steps required, a decrease in the photoetching processes, an improvement in the production yield, a reduction in the production cost, and enhancement of the reliability of the resulting resistive element.

The present invention provides a method wherein a non-linear resistive layer and a conductive layer which defines a row or column electrode are deposited in sequence and these layers are selectively etched so as to have substantially the same shape in the same masking step.

DESCRIPTION OF THE PREFERRED EMBODIMENTS

Figure 1A:
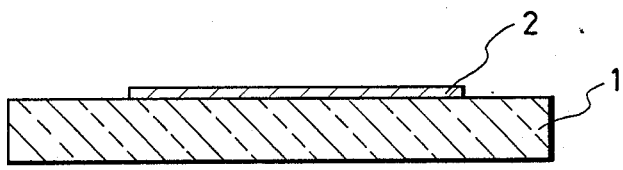
FIGS. 1a to 1e are sectional views showing sequentially the steps in the method of manufacturing a non-linear resistive element in accordance with one embodiment of the invention.
Figure 1B:
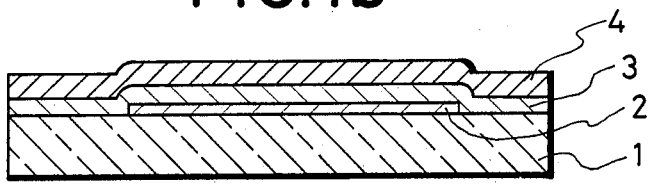
Figure 1C:
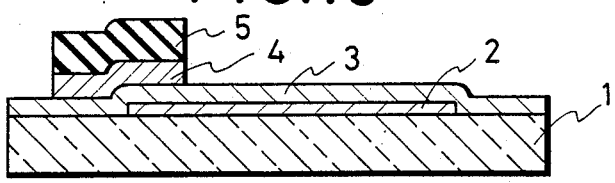
Figure 1D:
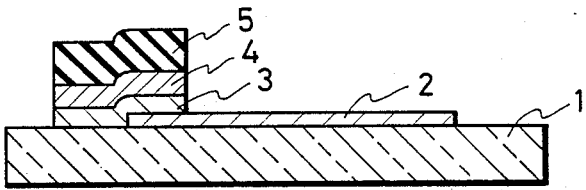
Figure 1E:
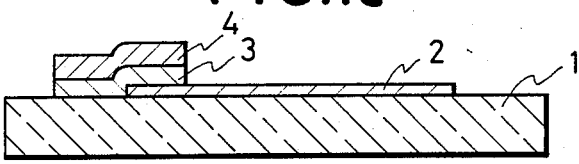

FIGS. 1a to 1e are sectional views showing sequentially the steps in the method of manufacturing a non-linear resistive element according to one embodiment of the present invention. The manufacturing method of the invention comprises: depositing a first conductive layer on a substrate and selectively forming the layer in a desired pattern so as to form a picture element electrode 2 (FIG. 1a), depositing a non-linear resistive layer 3 on the first conductive layer 2; depositing a second conductive layer 4 on the non-linear resistive layer 3 (FIG. 1b); forming the second conductive layer 4 in a desired pattern by etching process using a patterned resist layer 5 as a mask (FIG. 1c); and forming the non-linear resistive layer 3 in a desired pattern using the patterned resist layer 5 as a mask (FIG. 1d). FIG. 1e shows the cross-sectional structure of the non-linear resistive element after the process has been completed. Thus it is possible to produce a non-linear resistive element by carrying out only two masking steps.

The first conductive layer 2 is made of a light transmissive conductive material, e.g., ITO (Indium-Tin Oxide), $SnO_2$ or $In_2O_3$.

The substrate 1 is made of a light transmissive insulating material, e.g., glass, quartz, plastics or ceramics.

The non-linear resistive layer 3 may be formed by plasma CVD, CVD, sputtering, or the like and the layer may be made of silicon oxide, silicon nitride, silicon oxynitride, siliconcarbide, germanium oxide or germanium nitride, which has a larger content of silicon or germanium than that of the stoichiometric ratio, as described in U.S. Application Ser. No. 784,239 U.S. Pat. No. 4,828,370 or 863,199 abandoned. The atomic composition ratio of oxygen to silicon O/Si is within the range from about 0.1 to about 1.5 (preferably, 0.5 to 1.0), the ratio of nitrogen to silicon N/Si is within the range from about 0.1 to about 1.2 (preferably 0.4 to 1.2), the ratio (O+N)/Si is within about 0.1 to 1.5 (preferably 0.4 to 1.2) and the ratio O/N is preferably within about 0 to 0.5, the ratio C/Si is within about 0.05 to 1.5 (preferably 0.5 to 0.9), the ratio O/Ge is within about 0.2 to 2.0 (preferably 0.7 to 1.2), N/Ge is within about 0.2 to 1.2 (preferably 0.6 to 1.2), and C/Ge is within about 0.1 to 2.0 (preferably 0.7 to 1.1) respectively.

The second conductive layer 4 may be made of Cr, Al, Au/Cr, Mo, Ta, Ni-Cr alloy, ITO or the.

The resist layer 5 may be made of a positive or negative resist material, e.g., "OFPR 800"(positive) or "OMR-85"(negative) produced by Tokyo Ohka Kogyo Co., LTD., or "FH-2000"(positive) produced by FUJI-HUNT Electronics Technology Co., LTD.

Figure 2A:
FIGS. 2a to 2f are sectional views showing sequentially the steps in the manufacturing method in accordance with another embodiment of the invention.
Figure 2B:
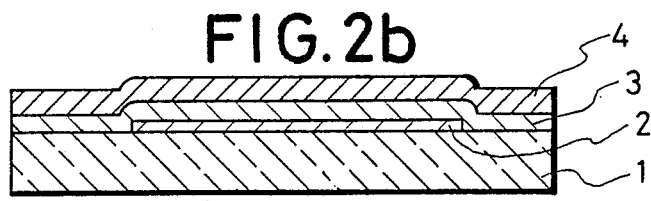
Figure 2C:
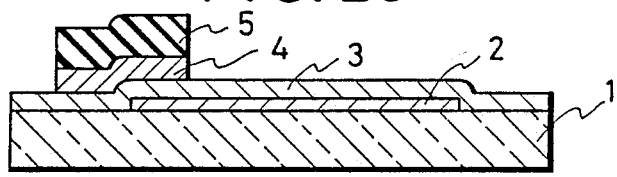
Figure 2D:
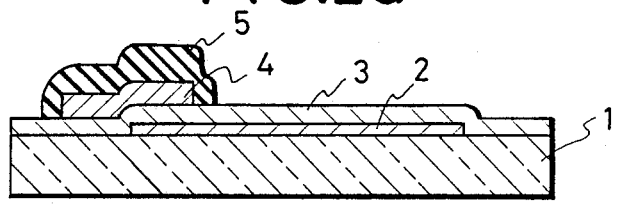
Figure 2E:
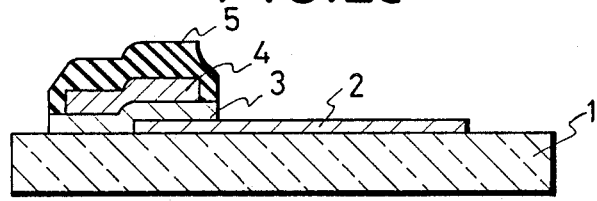
Figure 2F:
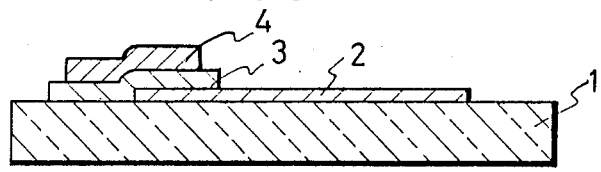

FIGS. 2a to 2e are sectional views showing a second embodiment of the non-linear resistive element manufacturing method according to the invention. Since the steps shown in FIGS. 2a to 2c are completely the same as those in the first embodiment which are shown in FIGS. 1a to 1c, description thereof is omitted. FIG. 2d is a section of the device structure in which, after the conductive layer 4 has been formed selectively using the resist 5 as a mask, the structure is heat-treated for 30 minutes at 160° C. in, for example, a clean oven to cause the end portions of the resist 5 to extend so as to cover the outer sides of the end portions of the conductive layer 4. FIG. 2e is a section of the device structure in which the non-linear resistive element 3 is formed selectively using the resist 5 as a mask. Finally, the resist 5 is removed to complete the device. Thus, as shown in FIG. 2f, the conductive layer 4 is formed so as to be slightly smaller (e.g., about 2 μm) than the non-linear resistive layer 3, so that, when this structure is used in a liquid crystal display device or the like, it is possible to prevent a current from flowing between the picture element electrode 2 and the conductive layer 4, serving as a row or column electrode, through the surface of the end portion of the non-linear resistive layer 3.

The proper temperature of the heat-treatment is decided by the kind of the resist layer 5, however, it is generally within the range of 120° C.–220° C.

Figure 3A:
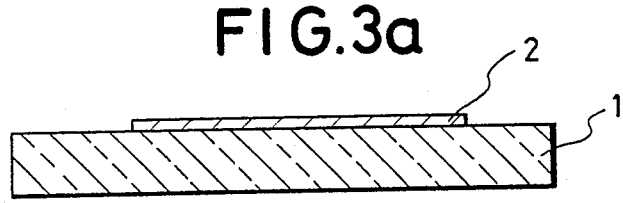
FIGS. 3a to 3f are sectional views showing sequentially the steps in the manufacturing method in accordance with still another embodiment of the invention.
Figure 3B:
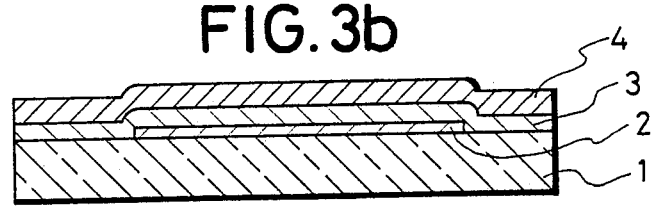
Figure 3C:
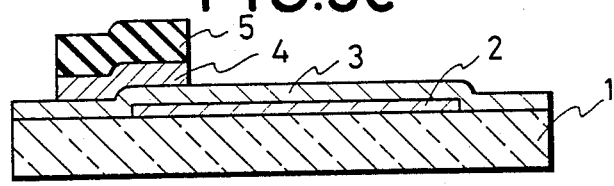
Figure 3D:
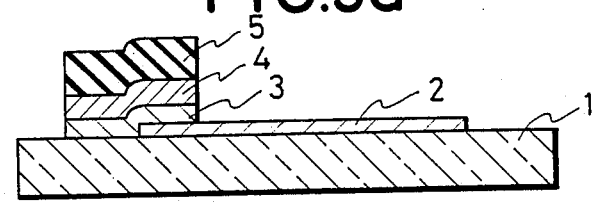
Figure 3E:
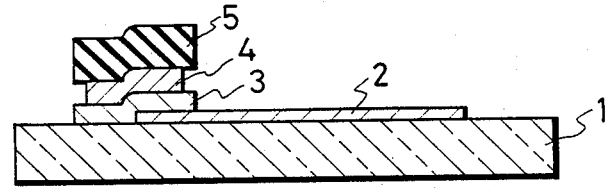
Figure 3F:
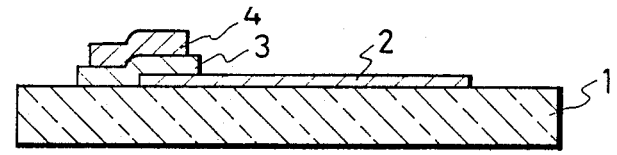

FIGS. 3a to 3f are sectional views showing the steps in a third embodiment of the manufacturing method according to the invention. Since the steps shown in FIGS. 3a to 3d are completely the same as those shown in FIGS. 1a to 1d, description thereof is omitted. In the step shown in FIG. 3e, after the conductive layer 4 and the non-linear resistive layer 3 have been etched in sequence, the conductive layer 4 is over-etched so that the conductive layer 4 becomes smaller than the non-linear resistive layer 3. When the resist 5 is removed, the device structure is completed as shown in FIG. 3f. Thus, the conductive layer 4 is formed so as to be slightly smaller (e.g., about 2 μm) than the non-linear resistive layer 3, and it is possible to obtain the same advantageous effect as that in the embodiment shown in FIG. 2. In the embodiments of FIGS. 2 and 3, it is preferable that the length difference between the non-linear resistive layer 3 and the conductive layer 4 is more than 0.5 μm.

Figure 4:
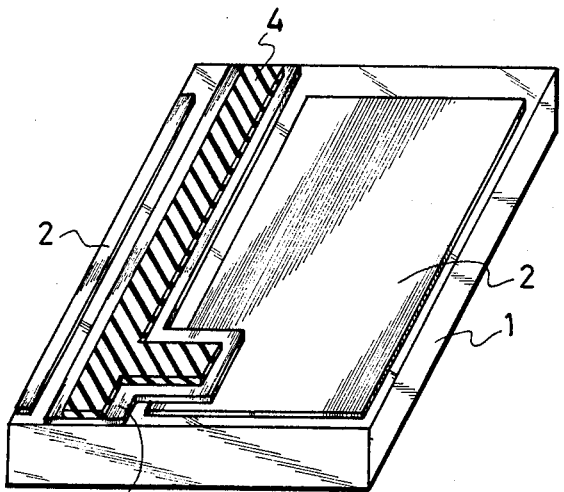
FIG. 4 is a perspective view of a non-linear resistive element produced by the method according to the invention.
Figure 5A:
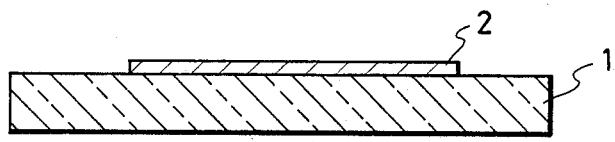
FIGS. 5a to 5c are sectional views showing sequentially the steps in a conventional method of manufacturing a non-linear resistive element.
Figure 5B:
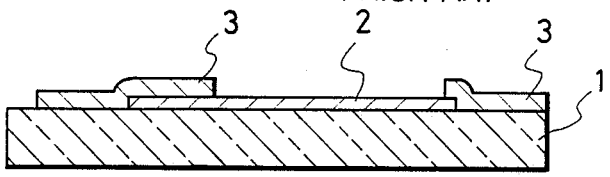
Figure 5C:
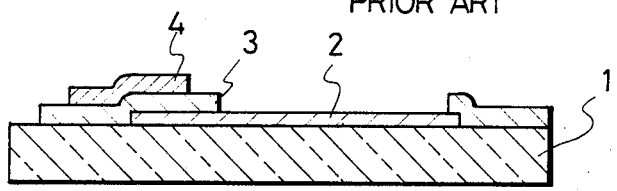

FIG. 4 is a perspective view showing an embodiment of a picture element which is formed using a non-linear resistive element produced by the method according to the invention. The picture element is composed of a light-transmissive insulating substrate 1 made of glass or the like, a picture element electrode 2 which is defined by a light-transmissive conductive layer made of ITO or the like, a non-linear resistive layer 3, and a conductive layer 4 which serves as a row or column electrode, the electrode 2 and the layers 3, 4 being formed on the substrate 1. To produce a liquid crystal display device, it is necessary to thereafter carry out orientation for a liquid crystal material, to bond the above described substrate 1 to another glass substrate having row or column electrodes, and seal in a liquid crystal material therebetween. However, description thereof is omitted in the specification of the invention.

The present invention may also be applied to electrochromic devices and electro-optical devices that utilize electro-optical solid materials such as PLZT, $BaTiO_3$ or the like, in addition to liquid crystal devices.

As will be clear from the foregoing description, the invention provides a method of manufacturing a non-linear resistive element wherein conductive layers are formed selectively using same mask, so that even if some dust resides on the resist layer 5 during the photo-etching process, it is possible to prevent the short-circuiting of the first and second conductive layers 2 and 4, because the non-linear resistive layer 3 is formed in approximately the same shape as the second conductive layer 4. Furthermore, it is possible to reduce the number of masking steps required in comparison with the prior art and it is therefore possible to lower the production cost and increase the production yield.

What is claimed is:

1. A method for manufacturing a non-linear resistive element array on a substrate, comprising:
  depositing a first conductive layer on the substrate and selectively forming the layer in a desired pattern;
  the first depositing a non-linear resistive layer on conductive layer;
  depositing a second conductive layer on the non-linear resistive layer;
  forming the second conductive layer in a desired pattern by photo-etching using a patterned resist layer;
  heat-treating the patterned resist layer on the patterned second conductive layer to extend the resist layer to cover the outer sides of the end portions of the second conductive layer; and
  forming the non-linear resistive layer in a desired pattern using the heat-treated resist layer as a mask.

2. A method as claimed in claim 1; wherein the non-linear resistive layer is made essentially of a non-stoichiometric compound of silicon oxide, silicon nitride, silicon oxynitride, silicon carbide, germanium oxide, germanium nitride or germanium carbide.

3. A method as claimed in claim 2; wherein the non-stoichiometric compound have a larger silicon content or a larger germanium content than that of the stoichiometric ratio.

4. A method as claimed in claim 1; wherein the non-linear resistive layer is made essentially of $Ta_2O_5$.

5. A method as claimed in claim 1; wherein the non-linear resistive layer is formed by one selected from the group consisting of plasma CVD, CVD or sputtering.

6. A method as claimed in claim 1; wherein the first conductive layer is made essentially of one selected from the group consisting of ITO, $SnO_2$ or $In_2O_3$.

7. A method as claimed in claim 1; wherein the second conductive layer is made essentially of one selected from the group consisting of Cr, Al, Au-Cr alloy, Mo, Ta, Ni-Cr alloy or ITO.

8. A method as claimed in claim 1; wherein the resist layer is made essentially of positive type resist material.

9. A method as claimed in claim 1; wherein the resist layer is made essentially of negative type resist material.

10. A method as claimed in claim 1; wherein the temperature of the heat treatment is within the range of 120° C. to 220° C.

11. A method for manufacturing a non-linear resistive element array on a substrate, comprising:
  depositing a first conductive layer on the substrate and selectively forming the layer in a desired pattern;
  depositing a non-linear resistive layer on the first conductive layer;
  depositing a second conductive layer on the non-linear resistive layer;
  forming the second conductive layer in a desired pattern by etching process using a patterned resist layer as a mask;
  forming the non-linear resistive layer in a desired pattern using the resist layer as a mask;
  and etching the second conductive layer so that the second conductive layer becomes smaller than the non-linear resistive layer.

12. A method as claimed in claim 11; wherein the non-linear resistive layer is made essentially of a non-stoichiometric compound of silicon oxide, silicon nitride, silicon oxynitride, silicon carbide, germanium oxide, germanium nitride or germanium carbide.

13. A method as claimed in claim 12; wherein the non-stoichiometric compound have a larger silicon content or a larger germanium content than that of the stoichiometric ratio.

14. A method as claimed in claim 11; wherein the non-linear resistive layer is made essentially of $Ta_2O_5$.

15. A method as claimed in claim 11; wherein the non-linear resistive layer is formed by one selected from the group consisting of plasma CVD, CVD or sputtering.

16. A method as claimed in claim 11; wherein the first conductive layer is made essentially of one selected from the group consisting of ITO, $SnO_2$ or $In_2O_3$.

17. A method as claimed in claim 11; wherein the second conductive layer is made essentially of one selected from the group consisting of Cr, Al, Au-Cr alloy, Mo, Ta, Ni-Cr alloy or ITO.

* * * * *